(12) United States Patent
Tsao

(10) Patent No.: US 7,621,758 B2
(45) Date of Patent: Nov. 24, 2009

(54) CONNECTOR WITH HIGH TORSION SUPPORT AND COAXIAL CONNECTOR ASSEMBLY THEREOF

(75) Inventor: Wei-Chun Tsao, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 11/925,578

(22) Filed: Oct. 26, 2007

(65) Prior Publication Data

US 2008/0045064 A1   Feb. 21, 2008

(30) Foreign Application Priority Data

Nov. 8, 2006   (TW)   ............... 95141231 A

(51) Int. Cl.
*H01R 12/00* (2006.01)
(52) U.S. Cl. ........................................ 439/79
(58) Field of Classification Search .................. 439/79, 439/80, 63, 581
See application file for complete search history.

(56) References Cited

U.S. PATENT DOCUMENTS

| | | | | |
|---|---|---|---|---|
| 3,668,608 A | * | 6/1972 | Ziegler, Jr. .................. | 439/248 |
| 3,701,083 A | * | 10/1972 | Ziegler, Jr. .................. | 439/248 |
| 3,783,321 A | * | 1/1974 | Patterson ..................... | 361/772 |
| 4,273,407 A | * | 6/1981 | Snuffer et al. ............... | 439/579 |
| 4,859,203 A | * | 8/1989 | Eckhaus ..................... | 439/404 |
| 5,295,853 A | * | 3/1994 | Nagakusa et al. ........... | 439/330 |
| 5,735,699 A | * | 4/1998 | Tan et al. ..................... | 439/92 |
| 5,769,661 A | * | 6/1998 | Nealis ........................ | 439/551 |
| 6,155,847 A | * | 12/2000 | Wright ........................ | 439/98 |
| 6,575,761 B1 | * | 6/2003 | Regnier ....................... | 439/63 |
| 6,575,762 B2 | * | 6/2003 | Evans ......................... | 439/63 |
| 6,824,392 B1 | * | 11/2004 | Guo ............................ | 439/63 |
| 6,877,996 B1 | * | 4/2005 | Franks, Jr. ................... | 439/92 |
| 7,029,305 B2 | | 4/2006 | Weidner | |
| 7,137,825 B2 | * | 11/2006 | Myer et al. ................... | 439/63 |

\* cited by examiner

*Primary Examiner*—Michael C Zarroli
*Assistant Examiner*—Harshad C Patel
(74) *Attorney, Agent, or Firm*—Banger Shia

(57) ABSTRACT

A connector with a high torsion support and the coaxial connector assembly thereof are provided. A supporting plate is provided behind the connector, and the supporting plate has a notch cooperating with an embedding portion of the connector, so that the embedding portion of the connector is restricted by the notch to provide the resistance along the rotating orientation for the connector. Thus, the torsion support of the connector is greatly increased.

9 Claims, 4 Drawing Sheets

CONNECTOR WITH HIGH TORSION SUPPORT AND COAXIAL CONNECTOR ASSEMBLY THEREOF

BACKGROUND OF THE INVENTION

1. Field of Invention

The invention relates to a connector applying to the connection with a rotary connecting part such as a coaxial cable and, more particularly, to a connector with a high torsion support and a coaxial connector assembly thereof.

2. Description of the Related Art

The coaxial cable is named for two kinds of conductors in the cable using the same central axis. The conductor in the center is an individual wire or a twisted wire, and the external conductor can be insulated from the outside signals in a weaving shielding manner, so that it applies to the high frequency or video signal transmission. More particularly, a notebook uses extremely thin coaxial cable, and an antenna module is built-in the wireless communication, so that the thin coaxial cable needs not only steady transmission characteristic, but also the characteristics of thinness and softness, and the degree of freedom of assembling to obtain shape of element should be large.

Therefore, the connector cooperating with a coaxial cable usually has a connecting portion with threads and has a small connecting hole in the center. The coaxial cable is combined with the connector in a rotating manner. Since the connecting manner is a rotating manner, the standard for the connector is designed by aiming at the torsion resistance. The need standard of torsion according to the Society of Cable Telecommunications Engineer (SCTE) is 30 inch-lb (34.59 kg-cm).

Although the common products on the market nowadays all can satisfy the standard, with the continuously increased demand of customers for the quality of the products and, more particularly, for products such as the cable modem and the set-top box in which the connector is soldered at a circuit board, the need for the torsion is often more than 60 inch-lb, and the present structure design is difficult to satisfy this need.

BRIEF SUMMARY OF THE INVENTION

The invention provides a connector with a high torsion support and a coaxial connector assembly thereof, which can provide high torsion resistance and satisfy the need, and have simple structure and do not increase the cost.

A connector with a high torsion support according to the invention includes a connector and a supporting plate. The connector includes a connecting portion, an embedding portion and a fixing pin. The connecting portion can be connected to the outside, and the fixing pin is used to connect to and fixed on the circuit board. The bottom of the supporting plate is also fixed on the circuit board, and the supporting plate has a notch restricting the two sides of the embedding portion of the connector, so that the rotation of the connector can be restricted. Therefore, the torsion resistance of the connector can be greatly increased.

The invention further provides a coaxial connector assembly with high torsion. The connecting portion of the connector is provided to be connected to the outside coaxial cable and cooperates with the shielding cover on the circuit board. The shielding cover shields the electronic elements on the circuit board and has a sliding track and a protrudent portion on the top, which can not only guide the assembly of the supporting plate, but also assist the torsion resistance of the auxiliary supporting plate.

These and other features, aspects, and advantages of the present invention will become better understood with regard to the following description, appended claims, and accompanying drawings.

DETAILED DESCRIPTION OF THE EMBODIMENTS

Figure 1:
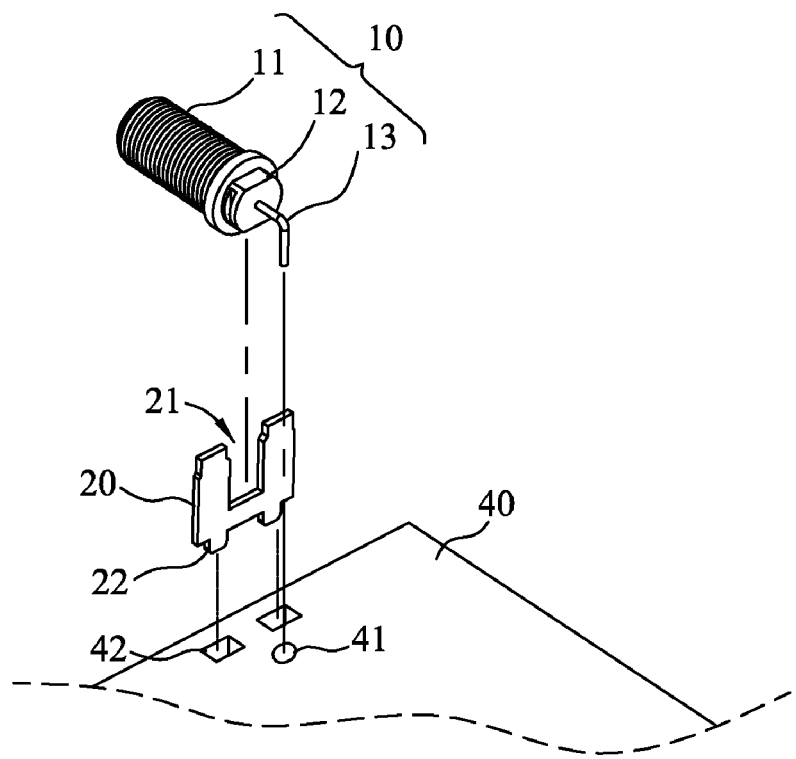
FIG. 1 is an explored diagram showing a connector with a high torsion support of the invention.

Please refer to FIG. 1. The connector with a high torsion support according to the invention includes a connector 10 and a supporting plate 20. The connector 10 includes a connecting portion 11, an embedding portion 12 and a fixing pin 13. The fixing pin 13 can be assembled in a hole 41 of the circuit board 40 to be fixed on the circuit board 40. The connecting portion 11 is the main body of the connector 10 and can be assembled with the outside element. For the embodiment of the invention, the connecting portion 11 can be assembled with the outside element such as a coaxial cable by rotating. The bottom of the supporting plate 20 has a fixing portion 22, and the top of the supporting plate 20 has a notch 21. The supporting plate 20 can be fixed on the circuit board 40 by assembling the fixing portion 22 at the fixing hole 42 of the circuit board 40. In practice, the fixing portion 22 is often fixed at the circuit board 40 by soldering.

Figure 3:
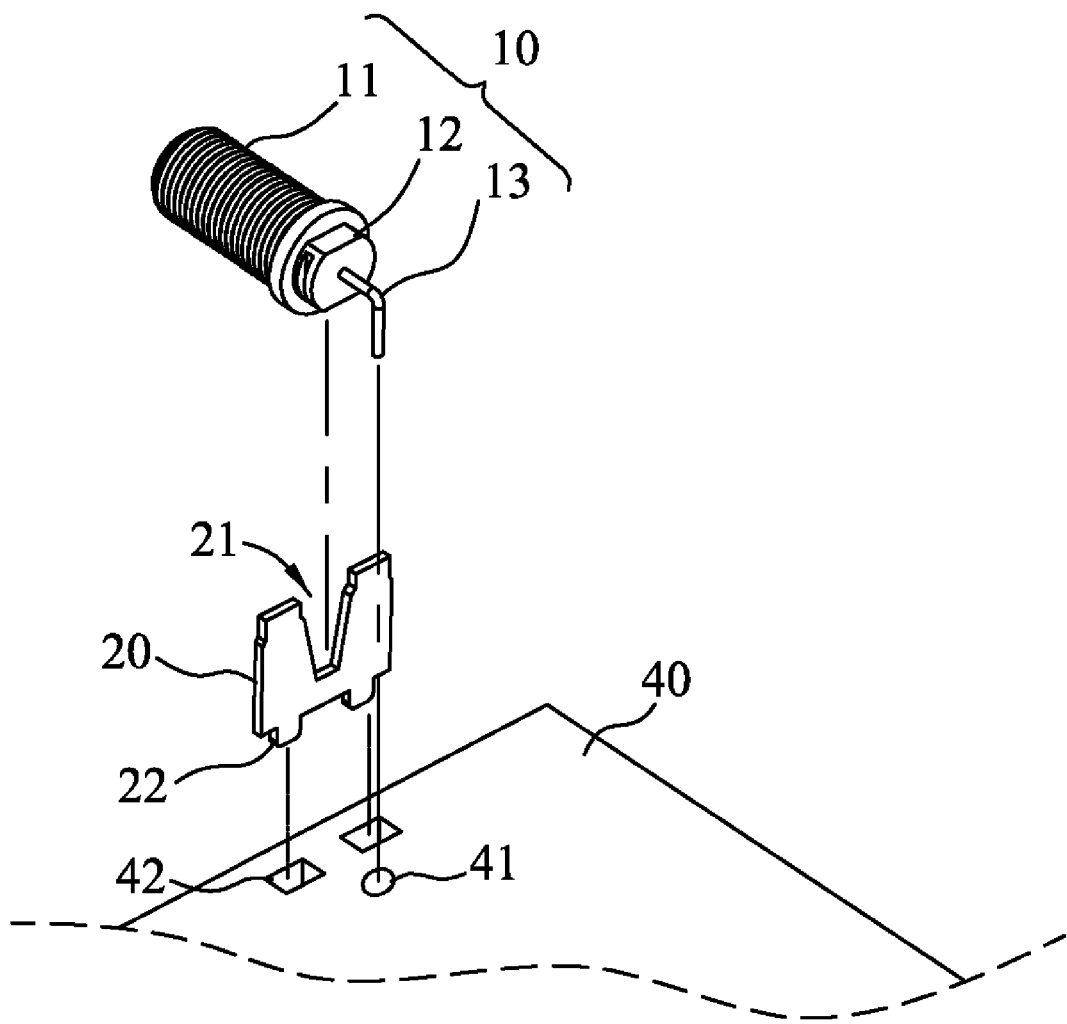
FIG. 3 is schematic diagram showing the notch of a connector with a high torsion support of another embodiment of the invention.

The notch 21 is designed for cooperating with the embedding portion 12 of the connector 10, and the widths of them are about the same, so that the connector 10 can be fastened at the supporting plate 20 via the embedding portion 12. Since the notch 21 is designed for cooperating with the embedding portion 12, and the widths of them are about the same, the rotation of the embedding portion 12 can be restricted. Furthermore, the rotation of the connector 10 is restricted to provide more torsion resistance for the connector 10. Therefore, the shape of the notch 21 is preferred to be designed to be non circular. The shape of the notch 21 can be a parallel square notch shown in FIG. 1 and also can be a trapeziform notch with a rake (shown in FIG. 3). The shape of the notch 21 is preferred to the same as that of the embedding portion 12. Based on this spirit, the shape can be change easily, so that if the torsion restriction can be provided for the middle of the connector 10, it is within the range of invention.

Figure 2:
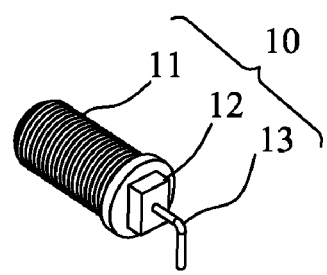
FIG. 2 is a schematic diagram showing the embedding portion of a connector with a high torsion support of another embodiment of the invention.

As shown in FIG. 1, the embedding portion 12 of the connector 10 is concavely provided at the connector 10. That is, the embedding portion 12 is processed by carving inward. Similarly, as shown in FIG. 2, the middle of the connector 10 has an embedding portion 12.

Figure 4:
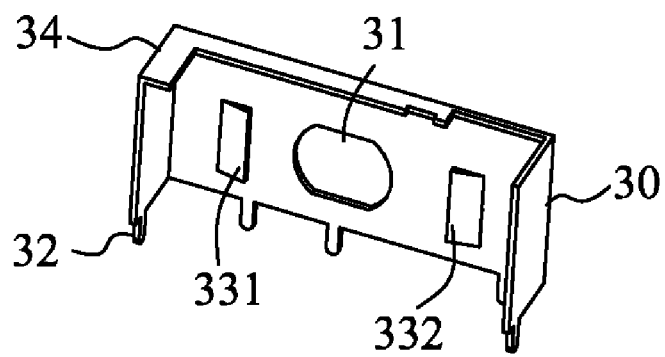
FIG. 4 is a schematic diagram showing the auxiliary supporting sheet of a connector with a high torsion support of the invention.
Figure 5:
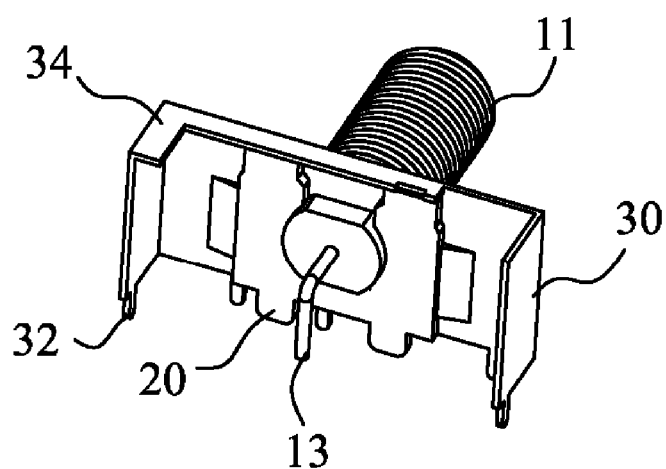
FIG. 5 is a schematic diagram showing the connector with a high torsion support combined with the auxiliary supporting sheet of the invention.

Please refer to FIG. 4 and FIG. 5. An auxiliary supporting sheet 30 can be provided in the invention. The auxiliary supporting sheet 30 has a through hole 31, at least a fixing portion 32 at the bottom, a protrudent portion 34 transversely formed at the top. Blocks 331 and 332 are symmetrically provided at the two sides of the through hole 31, and a sliding track is formed between the blocks 331 and 332. The sliding track can guide the supporting plate 20 to be assembled and located, and the through hole 31 can be passed by the fixing pin 13 of the connector 10 from one side. Therefore, the shape of the through hole 31 can be same with that of the middle of the connector 10. Then, the fixing pin 13 of the connector 10, the fixing portion 32 of the auxiliary supporting sheet 30 and the fixing portion 22 of the supporting plate 20 can be fixed on the circuit board 40 together (not shown in FIGS). In the above embodiment, the supporting plate 20 is the main source for providing the connector 10 with the torsion resistance, and is connected to and fixed on the circuit board 40 by the fixing portion 22 at the bottom, so that the connecting strength is the key to affect the torsion resistance of the connector 10. To further increase the torsion resistance, the sliding track can not only guide the supporting plate 20 to be assembled, and the blocks 331 and 332 at the two sides also can restrict the right and left moving capability of the supporting plate 20. Meanwhile, the capability for assisting the torsion resistance is also provided. The transverse protrudent portion 34 at the top has the same effect. The structure is simple, and the assembly is easy. The cost is hardly increased, and the capability of the torsion resistance of the connector is effectively increased. As shown in FIG. 5, the auxiliary supporting sheet 30 is provided between the supporting plate 20 and the connecting portion 11. Certainly, the position can be changed easily, and the auxiliary supporting sheet 30 can be provided between the supporting plate 20 and the fixing pin 13.

Figure 6A:
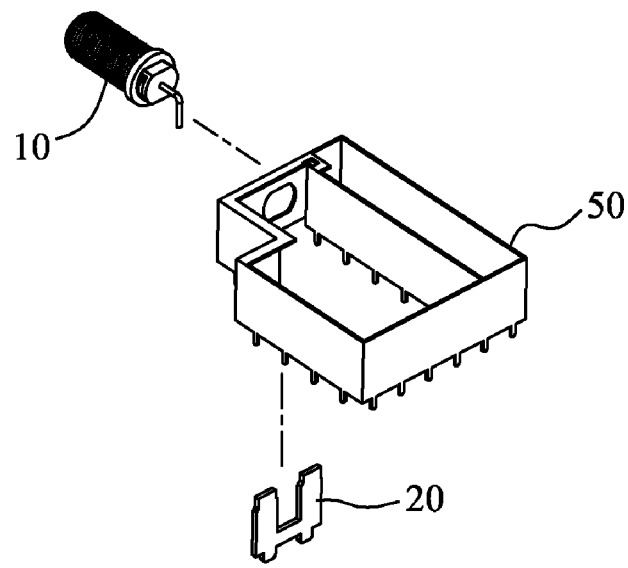
FIG. 6A and FIG. 6B are the schematic diagrams showing a coaxial connector assembly with a high torsion support of the invention.
Figure 6B:
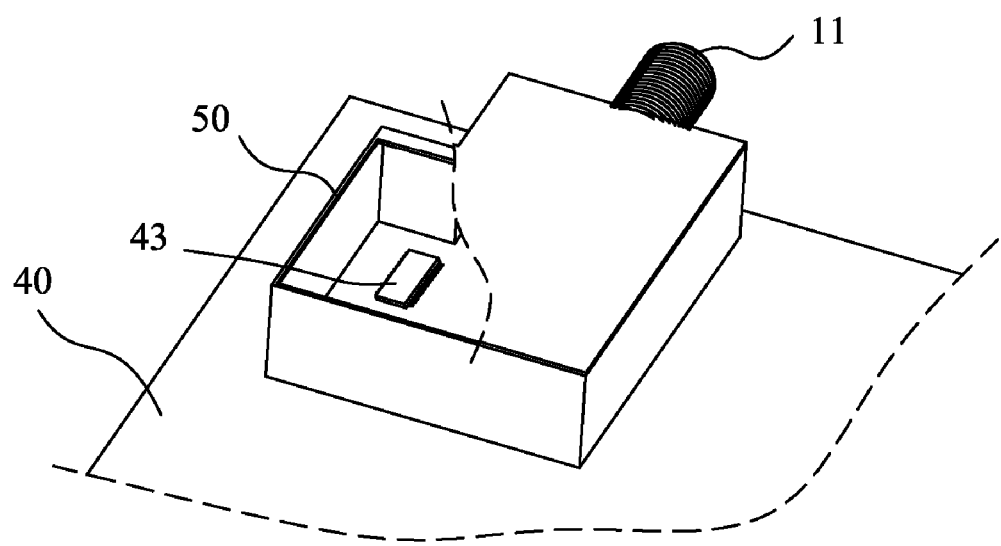

Please refer to FIG. 6A and FIG. 6B. The embodiment applies to the coaxial connector assembly. As for the coaxial connector used in high frequency transmission, the connecting portion 11 in the front of the coaxial connector 10 can be connected to a coaxial cable, and the coaxial cable is assembled by rotating, so that high torsion resistance is needed. The fixing pin 13 on the other end can not only be fixed at the circuit board 40, but also can be electrically connected to the electronic element 43 on the circuit board 40. As for the high frequency transmission, the electronic element 43 generates electromagnetic wave easily, so that a shielding cover 50 is usually designed to avoid the interference from the outside or to avoid affecting the other elements by the generated electromagnetic wave. The invention applies to the high speed coaxial connector, and the functions of the auxiliary supporting sheet 30 can be provided on the shielding cover 50 besides the design of the supporting plate 20. Therefore, the cost is reduced by existing elements, the assembly is more convenient, and the high torsion resistance is also provided.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A connector with a high torsion support which is assembled at a circuit board, the connector comprising:
    a connector having an embedding portion, wherein one end of the connector is a connecting portion, and another end is a fixing pin by which the connector is assembled at the circuit board;
    a supporting plate, wherein a bottom of the supporting plate is a fixing portion for being fixed at the circuit board, and a top of the supporting plate has a notch for assembling the embedding portion, and the notch restricts two sides of the embedding portion to prevent the embedding portion from rotating to increase the torsion resistance; and
    an auxiliary supporting sheet, and a bottom of the auxiliary supporting sheet is assembled at the circuit board, and the auxiliary supporting sheet has a through hole where the connector is provided;
    wherein the auxiliary supporting sheet includes two blocks at two sides of the supporting plate to restrict the supporting plate to increase the torsion resistance.

2. The connector with a high torsion support according to claim 1, wherein the notch is noncircular.

3. The connector with a high torsion support according to claim 2, wherein shape of the two sides of the embedding portion is the same with shape of two sides of the notch.

4. The connector with a high torsion support according to claim 1, wherein the auxiliary supporting sheet is provided between the embedding portion of the connector and the connecting portion via the through hole.

5. The connector with a high torsion support according to claim 1, wherein the auxiliary supporting sheet is provided between the embedding portion of the connector and fixing pin via the through hole.

6. The connector with a high torsion support according to claim 1, wherein the auxiliary supporting sheet has a protrudent portion, which is transversely extended from a top of the auxiliary supporting sheet, to be against the top of the supporting plate.

7. A coaxial connector assembly with a high torsion support which is assembled at a circuit board and electrically connected to an electronic element operative in high frequency transmission, the coaxial connector assembly comprising:
    a coaxial connector having an embedding portion, wherein one end of the coaxial connector is a connecting portion which is connected to a coaxial cable by rotating, and another end is a fixing pin by which the coaxial connector is assembled at the circuit board and be electrically connected to the electronic element;
    a shielding cover, wherein a bottom of the shielding cover is assembled at the circuit board to shield the electronic element, and the shielding cover has a through hole where the connector is provided; and
    a supporting plate, wherein a bottom of the supporting plate is a fixing portion for being fixed at the circuit board, and a top of the supporting plate has a notch for assembling the embedding portion, and the notch restricts two sides of the embedding portion to prevent the embedding portion from rotating to increase the torsion resistance;
    wherein the shielding cover includes two blocks at two sides of the supporting plate to restrict the supporting plate to increase the torsion resistance.

8. The coaxial connector assembly with a high torsion support according to claim 7, wherein the notch is noncircular.

9. The coaxial connector assembly with a high torsion support according to claim 7, wherein the shielding cover has a protrudent portion, which is transversely extended from a top of the shielding cover, to be against the top of the supporting plate.

* * * * *